(12) United States Patent
Shima

(10) Patent No.: US 10,490,147 B2
(45) Date of Patent: Nov. 26, 2019

(54) DISPLAY DEVICE

(71) Applicant: Japan Display Inc., Minato-ku (JP)

(72) Inventor: Takehiro Shima, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/268,091

(22) Filed: Feb. 5, 2019

(65) Prior Publication Data

US 2019/0172406 A1 Jun. 6, 2019

Related U.S. Application Data

(63) Continuation of application No. 15/417,703, filed on Jan. 27, 2017.

(30) Foreign Application Priority Data

Jan. 29, 2016 (JP) ................... 2016-016115

(51) Int. Cl.
*G09G 3/36* (2006.01)
*H01L 27/12* (2006.01)
(Continued)

(52) U.S. Cl.
CPC ......... *G09G 3/3611* (2013.01); *G02F 1/1362* (2013.01); *G02F 1/13454* (2013.01); *G09G 3/20* (2013.01); *G09G 3/3648* (2013.01); *G02F 2201/56* (2013.01); *G09G 2300/04* (2013.01); *G09G 2300/0426* (2013.01);
(Continued)

(58) Field of Classification Search
None
See application file for complete search history.

(56) References Cited

U.S. PATENT DOCUMENTS

2001/0040547 A1* 11/2001 Jinno ................... G09G 3/3677
345/92
2009/0102758 A1   4/2009 Anzai et al.
(Continued)

FOREIGN PATENT DOCUMENTS

CN        101281737 A     10/2008
CN        101295081 A     10/2008
(Continued)

OTHER PUBLICATIONS

Office Action dated Dec. 27, 2018, in Chinese Patent Application No. 201710059270.3 (with English-language translation).

*Primary Examiner* — Carl Adams
(74) *Attorney, Agent, or Firm* — Oblon, McClelland, Maier & Neustadt, L.L.P.

(57) ABSTRACT

According to one embodiment, a display device includes a pair of substrates including a display area in which pixels are arranged, pixel electrodes and memories provided in the pixels, signal lines supplied with digital signals, switching elements connecting the memories and the signal lines, scanning lines supplied with scanning signals, a first driver unit, and a second driver unit. The first driver unit is provided in a peripheral area around the display area, and supplies the digital signal to the signal line. The second driver unit is provided in the peripheral area, and supplies the scanning signal to the scanning line. In the display device, at least a part of the first driver unit is provided between the display area and the second driver unit.

7 Claims, 13 Drawing Sheets

(51) Int. Cl.
  *G02F 1/1345* (2006.01)
  *G02F 1/1362* (2006.01)
  *G09G 3/20* (2006.01)
  *G11C 11/41* (2006.01)

(52) U.S. Cl.
  CPC .............. *G09G 2300/0452* (2013.01); *G09G 2300/0857* (2013.01); *G09G 2310/0278* (2013.01); *G09G 2310/0291* (2013.01); *G09G 2310/08* (2013.01); *G11C 11/41* (2013.01)

(56) References Cited

U.S. PATENT DOCUMENTS

| | | |
|---|---|---|
| 2013/0207134 A1 | 8/2013 | Shin et al. |
| 2014/0111756 A1* | 4/2014 | Yokogawa ............ G02F 1/1339 349/153 |
| 2015/0201492 A1* | 7/2015 | Kim ...................... H05K 1/028 361/749 |
| 2016/0027380 A1 | 1/2016 | Kim et al. |
| 2016/0190166 A1* | 6/2016 | Kim ...................... H01L 27/124 257/71 |

FOREIGN PATENT DOCUMENTS

| | | |
|---|---|---|
| CN | 104732908 A | 6/2015 |
| CN | 104732936 A | 6/2015 |
| JP | 2009-122636 | 6/2009 |

* cited by examiner

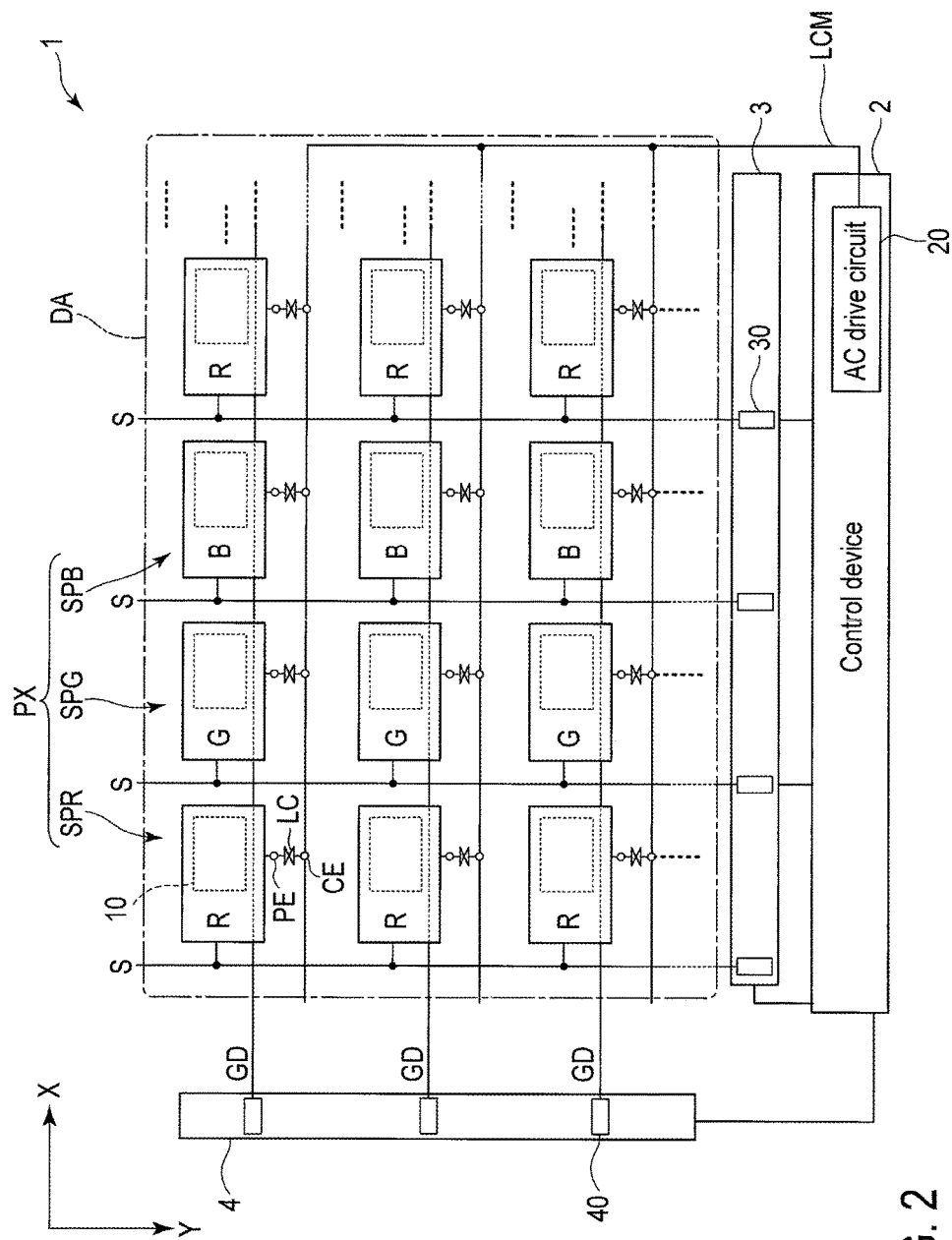
F I G. 2

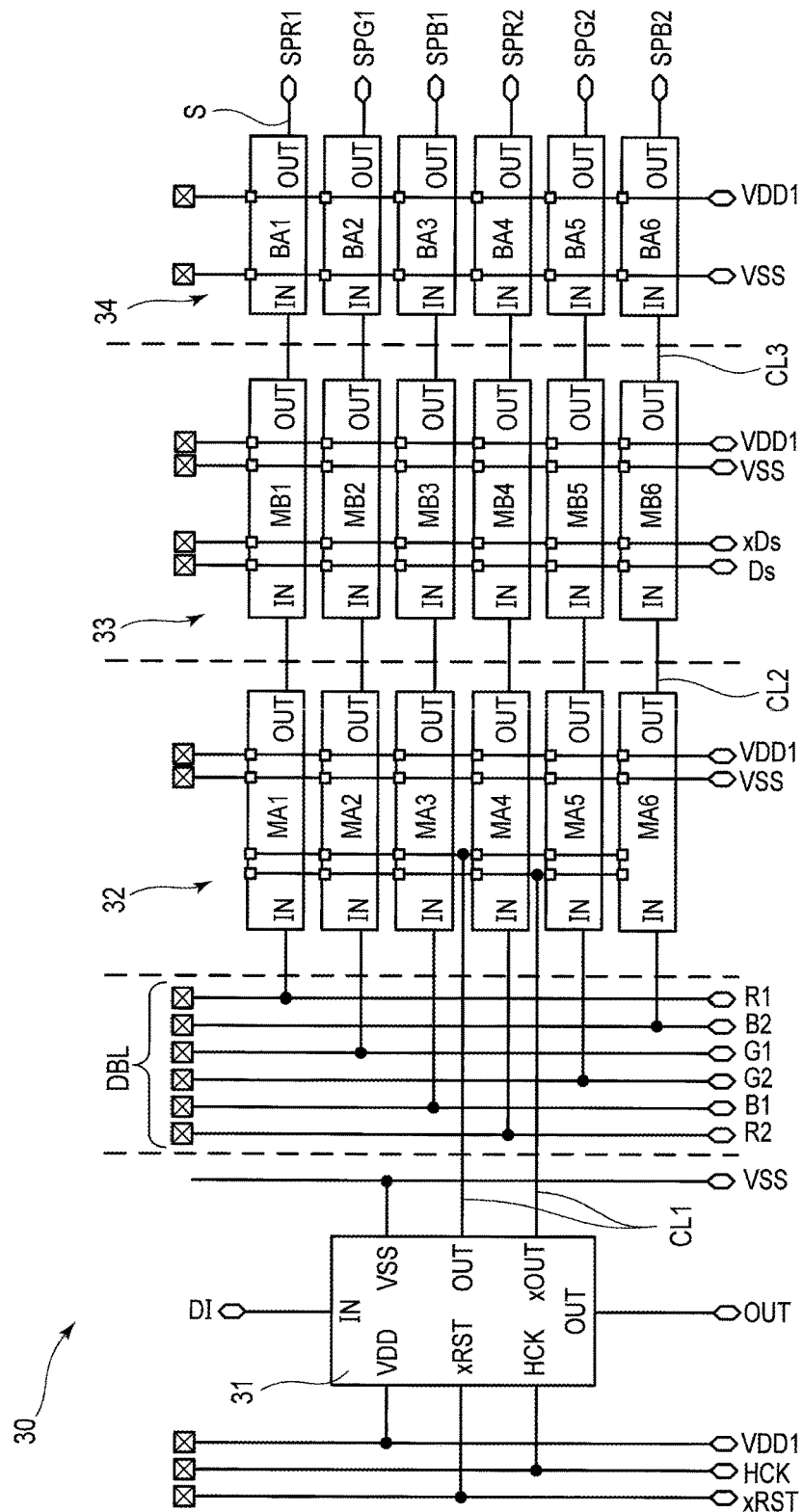
F I G. 6

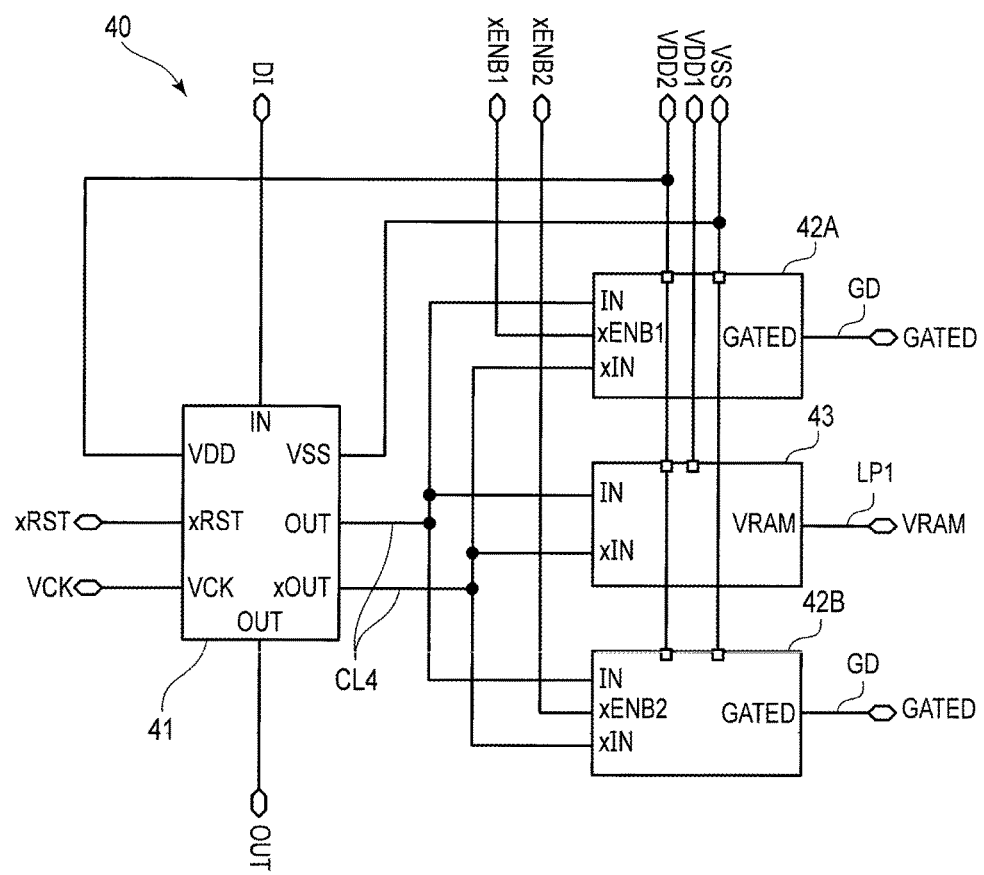
F I G. 7

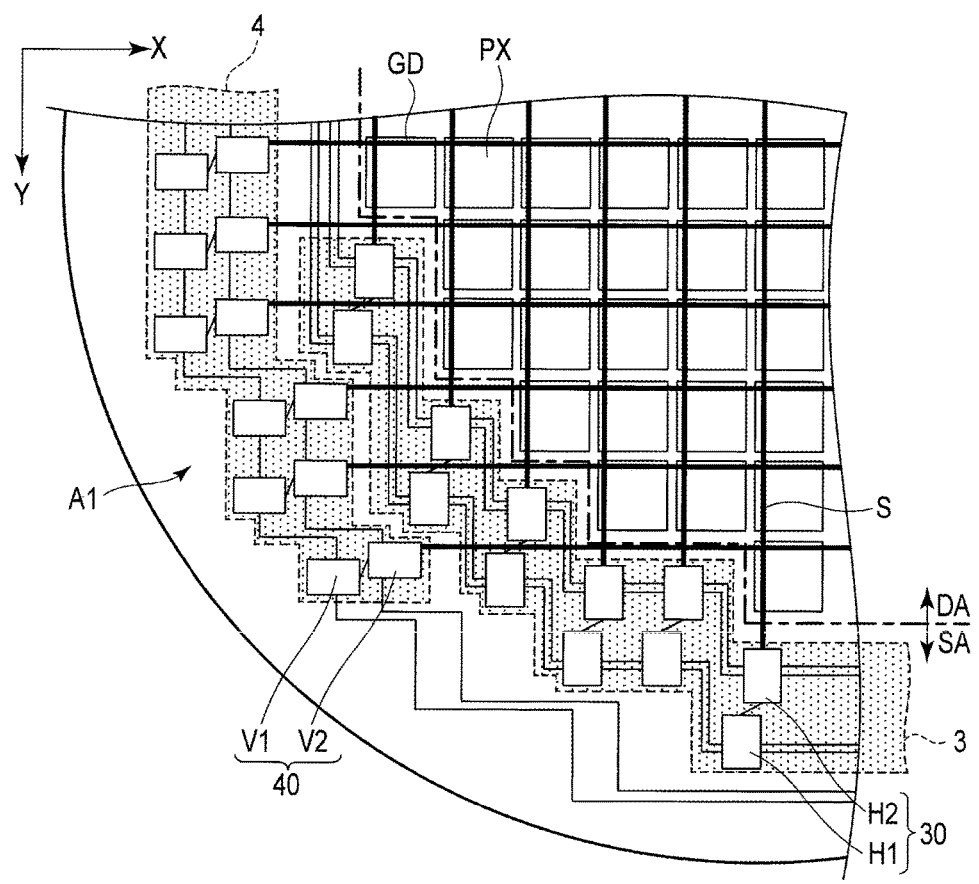
F I G. 9

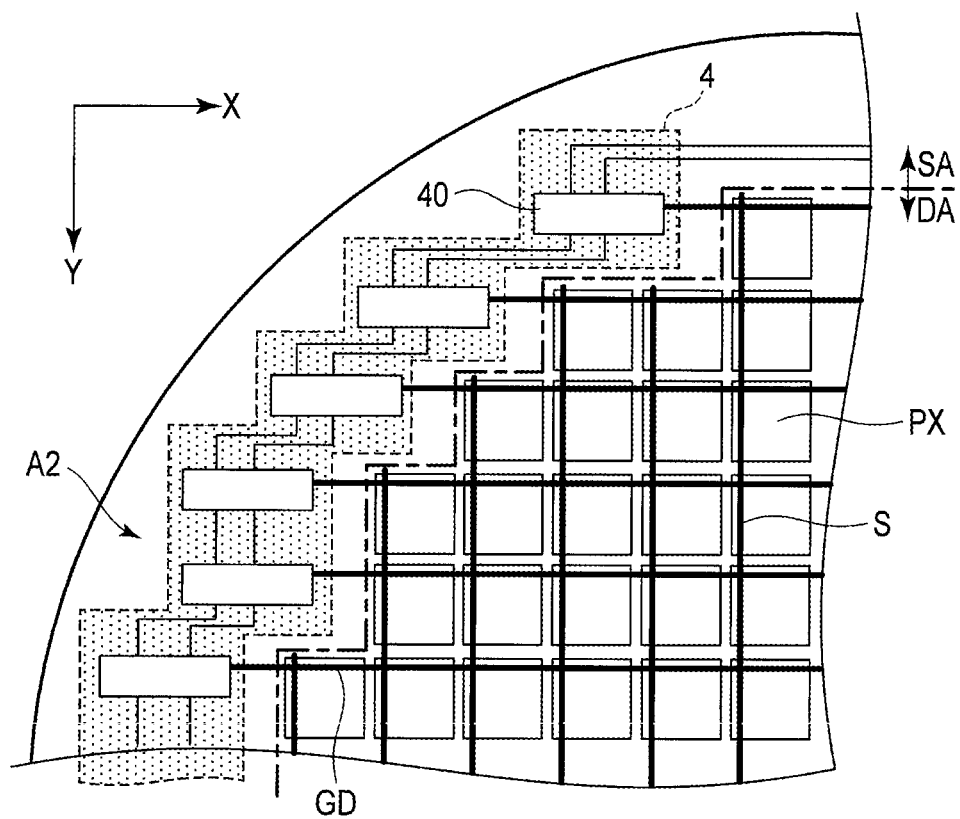
F I G. 10

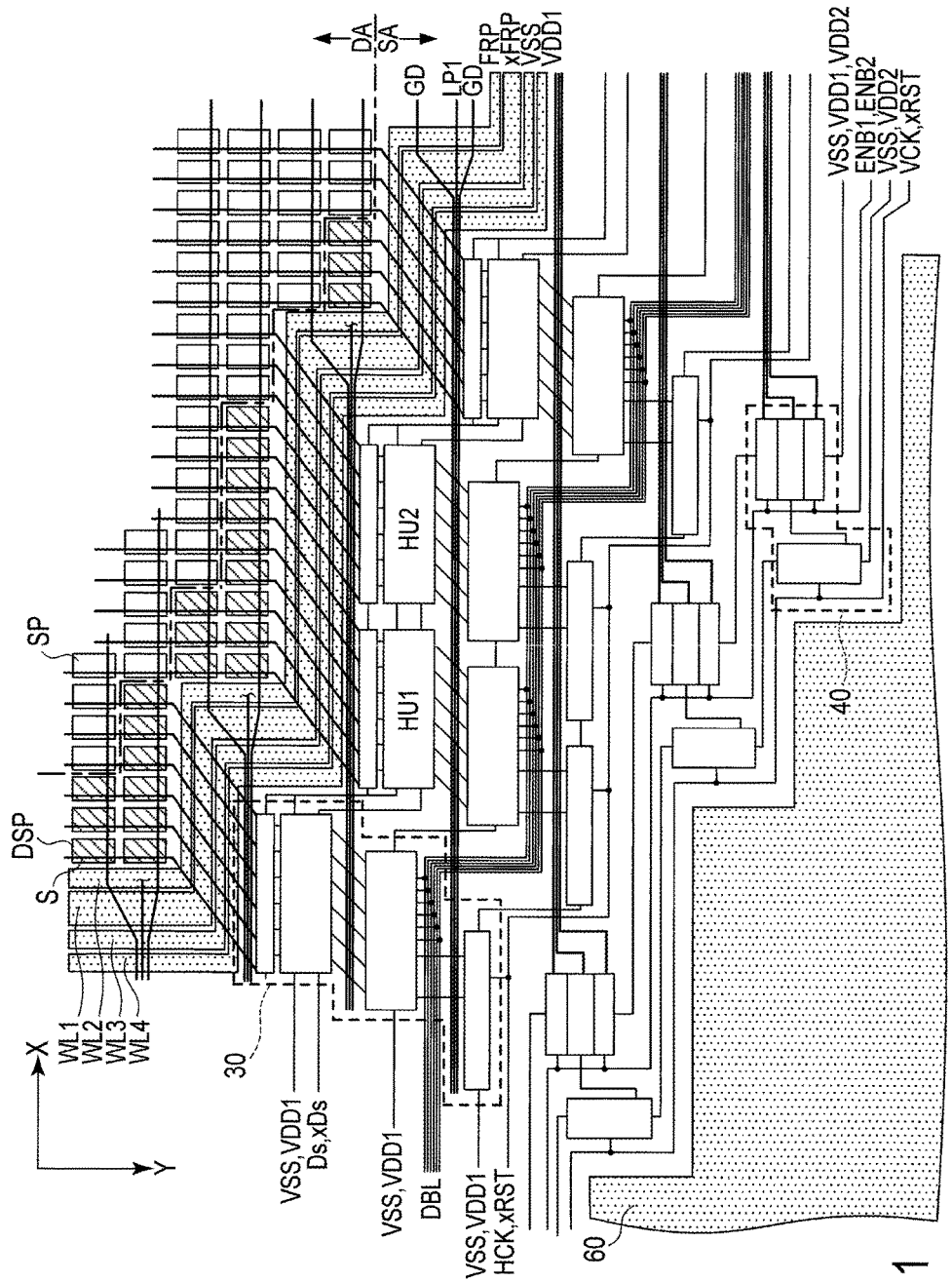
F I G. 11

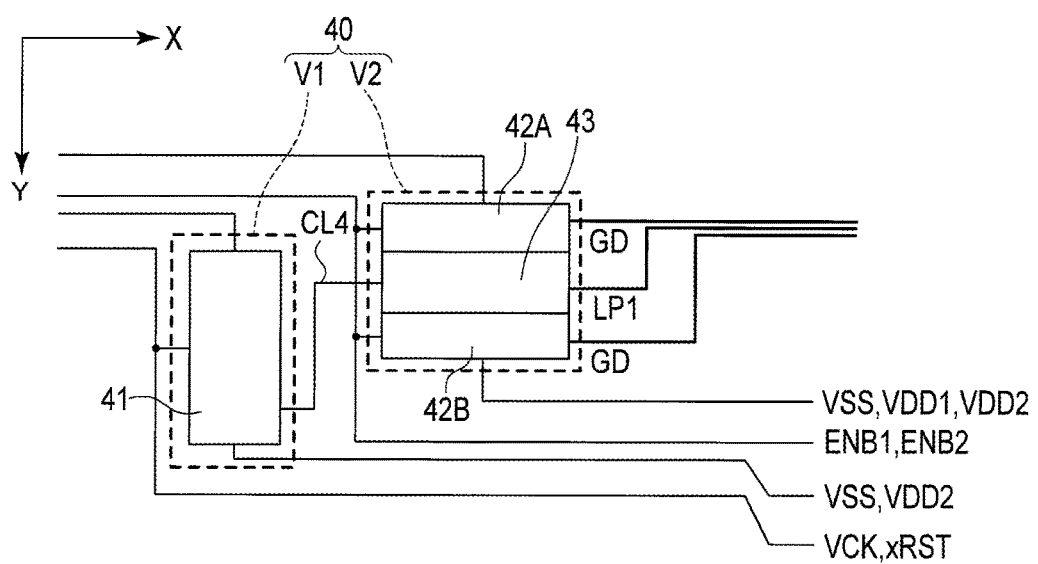
F I G. 13 ved, and sets the drive potential of each pixel to potential corresponding to the digital signal stored in the memory. In this way, the display device displays the image in the display area. The system for driving the pixels based on the digital signals stored in the memories in the above manner is called a digital mode or a digital driving system.

DISPLAY DEVICE

CROSS-REFERENCE TO RELATED APPLICATIONS

This application is a continuation of U.S. application Ser. No. 15/417,703 filed Jan. 27, 2017 and is based upon and claims the benefit of priority from Japanese Patent Application No. 2016-016115, filed Jan. 29, 2016, the entire contents of each of which are incorporated herein by reference.

FIELD

Embodiments described herein relate generally to a display device.

BACKGROUND

Display devices such as liquid crystal display devices in which a memory is provided for each pixel in a display area are known. This type of display device writes a digital signal to each memory in accordance with the image to be displayed, and sets the drive potential of each pixel to potential corresponding to the digital signal stored in the memory. In this way, the display device displays the image in the display area. The system for driving the pixels based on the digital signals stored in the memories in the above manner is called a digital mode or a digital driving system.

The display device is required to minimize the peripheral area around the display area (in other words, to minimize the width of the frame). In the display device in digital mode, various lines and circuits need to be provided in the peripheral area to control the memories. Thus, the circuit layout of the peripheral area must be designed in some way to reduce the width of the frame.

BRIEF DESCRIPTION OF THE DRAWINGS

FIG. 2 shows an example of the circuit structure of the display device.

FIG. 6 shows the general structure of a first circuit unit provided in the display device.

FIG. 7 shows the general structure of a second circuit unit provided in the display device.

FIG. 9 shows another example of a circuit layout applicable to the first and second driver units in the first area.

FIG. 10 shows an example of a circuit layout applicable to the second driver unit in a second area included in the peripheral area.

FIG. 11 shows a specific example of a circuit layout applicable to the first area.

FIG. 13 is an enlarged view of the second circuit unit of FIG. 11.

DETAILED DESCRIPTION

Figure 1:
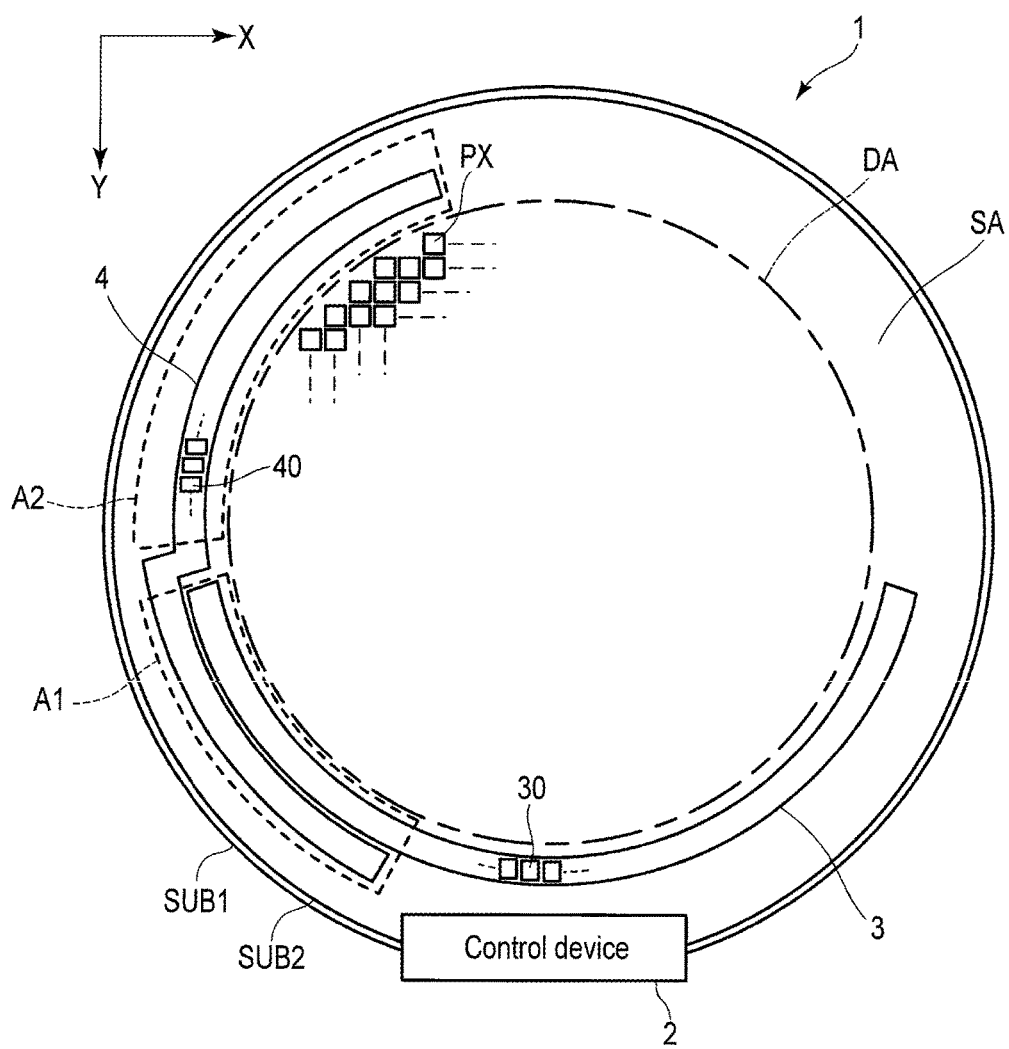
FIG. 1 shows an example of the overall structure of a display device according to one embodiment.

In general, according to one embodiment, a display device comprises a pair of substrates, an optical element layer, pixel electrodes, memories, signal lines, switching elements, scanning lines, a first driver unit and a second driver unit. The pair of substrates comprises a display area in which a plurality of pixels are arranged. The optical element layer is provided between the pair of substrates. The pixel electrodes and the memories are provided in the respective pixels. The signal lines are supplied with digital signals to be stored in the memories. The switching elements connect the memories and the signal lines. The scanning lines are supplied with scanning signals for controlling the switching element. The first driver unit is provided in a peripheral area around the display area, and is configured to supply the digital signals to the signal lines. The second driver unit is provided in the peripheral area, and is configured to supply the scanning signals to the scanning lines. In the display device, at least a part of the first driver unit is provided between the display area and the second driver unit.

One embodiment will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the drawings show schematic illustration rather than as an accurate representation of what is implemented. However, such schematic illustration is merely exemplary, and in no way restricts the interpretation of the invention. In the drawings, reference numbers of continuously arranged elements equivalent or similar to each other are omitted in some cases. Further, in the specification and drawings, structural elements which function in the same or a similar manner to those described in connection with preceding drawings are denoted by like reference numbers, detailed description thereof being omitted unless necessary.

In the present embodiment, as an example of a display device, a liquid crystal display device having the function of the above digital mode is disclosed. However, the present embodiment does not prevent application of individual technical ideas disclosed in the embodiment to other types of display devices. Other types of display devices are assumed to be, for example, a self-luminous display device such as an organic electroluminescent display (OELD) device, or an electronic paper display device having a cataphoresis element.

This specification explains the basic structure and operation of a display device with reference to FIG. 1 to FIG. 5.

FIG. 1 is a plan view showing an example of the overall structure of a display device 1. The display device 1 comprises a first substrate SUB1 and a second substrate SUB2. The first substrate SUB1 is attached to the second substrate SUB2 such that they face each other. A liquid crystal layer (specifically, the liquid crystal layer LC described later) is sealed between the first substrate SUB1 and the second substrate SUB2. The liquid crystal layer is an example of an optical element layer. As other optical element layers, the above organic electroluminescent element, the above cataphoresis element and a microelectromechanical systems (MEMS) shutter element are considered.

The display device 1 comprises a display area DA, and a peripheral area SA surrounding the display area DA. In the overlapping area of the first and second substrates SUB1 and SUB2, the display area DA is equivalent to an area in which an image is displayed. Pixels PX are provided in the display area DA. Specifically, a large number of pixels PX are arranged in matrix in a first direction X and a second direction Y in the display area DA. The first direction X is, for example, perpendicular to the second direction Y. In the overlapping area of the first and second substrates SUB1 and SUB2, the peripheral area SA is equivalent to an area outside the display area DA.

In the example of FIG. 1, the display area DA is precisely circular. However, the display area DA may have other shapes, such as an oval shape, a polygonal shape, or a shape including a curve at least in a part of the outline. In the example of FIG. 1, the first substrate SUB1, the second substrate SUB2 and the peripheral area SA are also precisely circular. However, the first substrate SUB1, the second substrate SUB2 and the peripheral area SA may have other shapes in a manner similar to that of the display area DA.

The display device 1 further comprises a control device 2, a first driver unit 3 and a second driver unit 4. The control device 2 is, for example, an integrated circuit mounted on the first substrate SUB1, and functions as a signal supply portion which outputs various signals necessary for displaying an image based on the image data input from outside. The control device 2 may not be mounted on the first or second substrate SUB1 or SUB2, and may be connected to the first and second substrates SUB1 and SUB2 via a flexible wiring board.

For example, the first driver unit 3 and the second driver unit 4 are formed on the first substrate SUB1 in the peripheral area SA. In the example of FIG. 1, the first driver unit 3 has an arc-shape along the marginal portion of the lower part of the display area DA (in other words, along the marginal portion on the control device 2 side). The second driver unit 4 has an arc-shape along the marginal portion of the left part of the display area DA. The first driver unit 3 may be called a horizontal driver, a signal line drive circuit, a source driver, etc. The second driver unit 4 may be called a vertical driver, a scanning line drive circuit, a gate driver, etc.

For example, the peripheral area SA is shielded against light by a light-shielding layer formed on the second substrate SUB2. The light-shielding layer can prevent light leak from the peripheral area SA and light reflection on the circuits or lines formed in the peripheral area SA.

The first driver unit 3 comprises a plurality of first circuit units 30. The second driver unit 4 comprises a plurality of second circuit units 40.

The peripheral area SA comprises a first area A1 and a second area A2. In the first area A1, a part of the first driver unit 3 (in other words, at least one of the first circuit units 30) is located between the second driver unit 4 and the display area DA. In the second area A2, the first driver unit 3 is not located between the second driver unit 4 and the display area DA. In other words, the first area A1 includes the second circuit units 40 and at least one of the first circuit units 30. The second area A2 includes the second circuit units 40 and does not include any first circuit unit 30.

FIG. 2 shows the general circuit structure of the display device 1. To simplify the figure, the display area DA is shown as a rectangular area, and the first and second driver units 3 and 4 are linearly shown. In the present embodiment, each pixel PX includes red (R), green (G) and blue (B) subpixels SP. In the following explanation, the red, green and blue subpixels SP are called subpixels SPR, SPG and SPB, respectively. In the present disclosure, each subpixel SP may be simply referred to as a pixel in some cases.

In the example of FIG. 2, subpixels SPR, SPG and SPB included in each pixel PX are arranged in the first direction X. However, the layout of the pixels PX is not limited to the example of FIG. 2. For example, each pixel PX may further include a subpixel SP corresponding to another color such as white (W). At least one or some of subpixels SP included in each pixel PX may be arranged in the second direction Y. Each pixel PX may include a plurality of subpixels SP corresponding to the same color.

The display device 1 comprises a plurality of signal lines S and a plurality of scanning lines GD. The signal lines S and the scanning lines GD are formed in the first substrate SUB1. The signal lines S are connected to respective first circuit units 30. The scanning lines GD are connected to respective second circuit units 40. The signal lines S extend in the display area DA in the second direction Y, and are arranged in the first direction X. The scanning lines GD extend in the display area DA in the first direction X, and are arranged in the second direction Y.

Each subpixel SP comprises a memory 10 and a pixel electrode PE in the first substrate SUB1. The memory 10 stores a digital signal supplied via the signal line S. The pixel electrode PE faces a common electrode CE formed in the second substrate SUB2. The common electrode CE may be formed in the first substrate SUB1. The pixel electrode PE and the common electrode CE may be formed of a transparent conductive material such as indium tin oxide (ITO). The common electrode CE is formed over a plurality of subpixels SP, and is connected to an AC drive circuit 20 provided in the control device 2 via a common electrode line LCM.

The display device 1 comprises a color filter facing a corresponding subpixel SP. The colors of the color filters correspond to the display colors of their respective opposite subpixels SP. The color filters are formed in, for example, the second substrate SUB2.

The display device 1 may be, for example, a reflective type display device. In this case, a reflective layer for reflecting outside light is formed in the display area DA. An image is displayed using the light reflected on the reflective layer. A front light may be provided on the external side of the second substrate SUB2 such that an image is displayed using the light emitted from the front light.

The display device 1 may be a transmissive type display device. In this case, a backlight is provided on the rear side of the first substrate SUB1 such that an image is displayed using the light emitted from the backlight. The display device 1 may have both the reflective function and the transmissive function.

Figure 3:
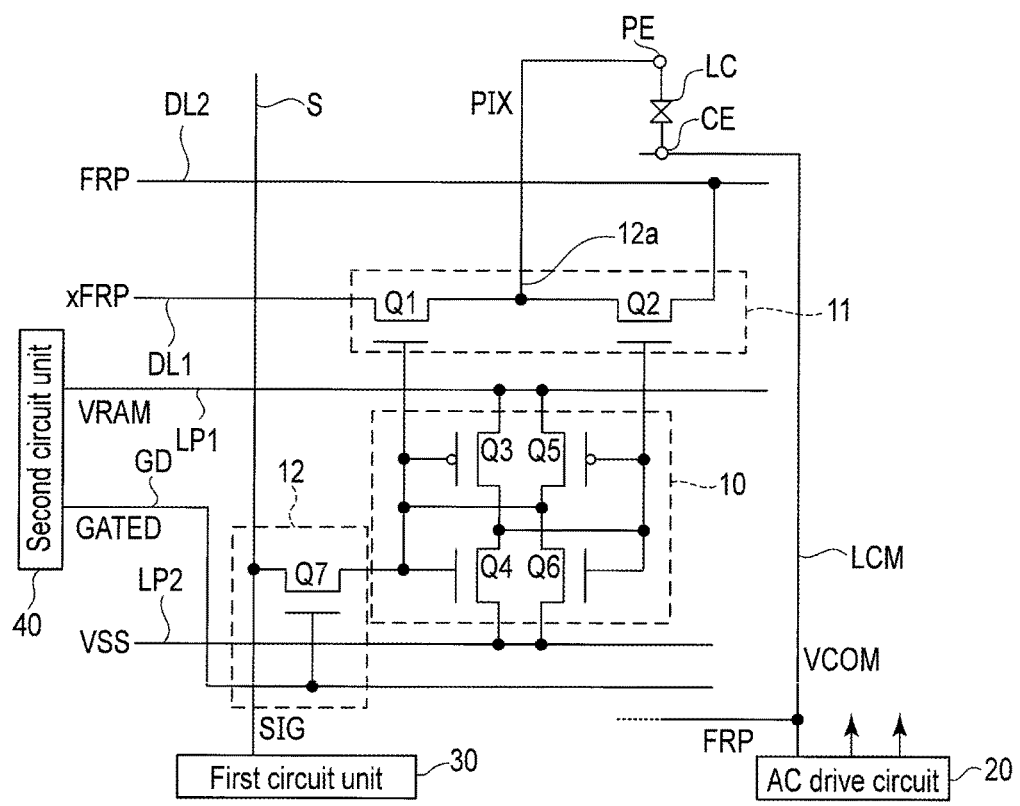
FIG. 3 shows an example of the equivalent circuit of a subpixel provided in the display device.

FIG. 3 shows an example of the equivalent circuit of each subpixel SP. Each subpixel SP comprises the above pixel electrode PE, the above memory 10, a select control circuit 11, and a storage control circuit 12.

The select control circuit 11 comprises a switching element Q1 whose input terminal is connected to a first drive line DL1, and a switching element Q2 whose input terminal is connected to a second drive line DL2. For example, a first drive signal xFRP which is the display signal of an image is supplied from the control device 2 to the first drive line DL1. A second drive signal FRP which is the non-display signal of an image is supplied from the AC drive circuit 20 to the second drive line DL2.

The select control circuit 11 further comprises a select signal line 12a connecting the output terminals of switching elements Q1 and Q2 and the pixel electrode PE.

In FIG. 3, the line extending from the AC drive circuit 20 branches off to the second drive line DL2 and the common electrode line LCM. Thus, in this example, signals FRP and VCOM have the same potential.

The memory 10 comprises switching elements Q3 to Q6. A first power line LP1 is connected to the input terminals of switching elements Q3 and Q5. Power source voltage VRAM is applied to the first power line LP1 from the second circuit unit 40. A second power line LP2 to which voltage VSS is applied is connected to the input terminals of switching elements Q4 and Q6. The output terminals of switching elements Q3 and Q4 are connected to the control terminal of switching element Q2 to structure a first inverter. The output terminals of switching elements Q5 and Q6 are connected to the control terminal of switching element Q1 to structure a second inverter. These inverters are parallely connected in opposite directions, and selectively turn on one of switching elements Q1 and Q2.

The first circuit unit 30 supplies a digital signal SIG to the signal line S. The storage control circuit 12 is a circuit for storing a digital signal SIG supplied to the signal line S in the memory 10, and comprises a switching element Q7. The input terminal of switching element Q7 is connected to the signal line S. The output terminal of switching element Q7 is connected to the control terminals of switching elements Q3 and Q4. The scanning line GD is connected to the control terminal of switching element Q7. A scanning signal GATED is supplied from the second circuit unit 40 to the scanning line GD.

All of switching elements Q1 to Q7 are, for example, thin-film transistors, and are formed in the first substrate SUB1. The first drive line DL1 the second drive line DL2, the first power line LP1, the second power line LP2 and the scanning line GD are also formed in the first substrate SUB1, and are connected to the subpixels SP arranged in the first direction X.

The display device 1 having the above structure is allowed to drive each subpixel SP in digital mode. The digital mode is a system for controlling the luminance of each subpixel SP in monochrome by simply applying on and off based on the digital signal stored in the memory 10. In the following explanation, it is assumed that the display device 1 is a display device in normally-black mode. It is assumed that, when the memory 10 is made high (high potential), the subpixel SP is on (white display). It is assumed that, when the memory 10 is made low (low potential), the subpixel SP is off (black display).

In digital mode, a storage period and a display period are repeated. In a storage period, a digital signal SIG supplied to each signal line S is stored in the memories 10. In a display period, the first or second drive signal xFRP or FRP is selectively supplied to each pixel electrode PE in accordance with the digital signal (a high or low digital signal) stored in the memory 10.

In the following explanation, a group of subpixels SP arranged in the first direction X in the display area DA is called a horizontal line. In a storage period, a scanning pulse is supplied to each scanning line GD in series. The digital signal SIG of a horizontal line corresponding to each scanning line GD supplied with the scanning pulse is supplied to each signal line S in series. In this way, the digital signal SIG is written to each memory 10 in series in accordance with image data based on each horizontal line.

Figure 4:
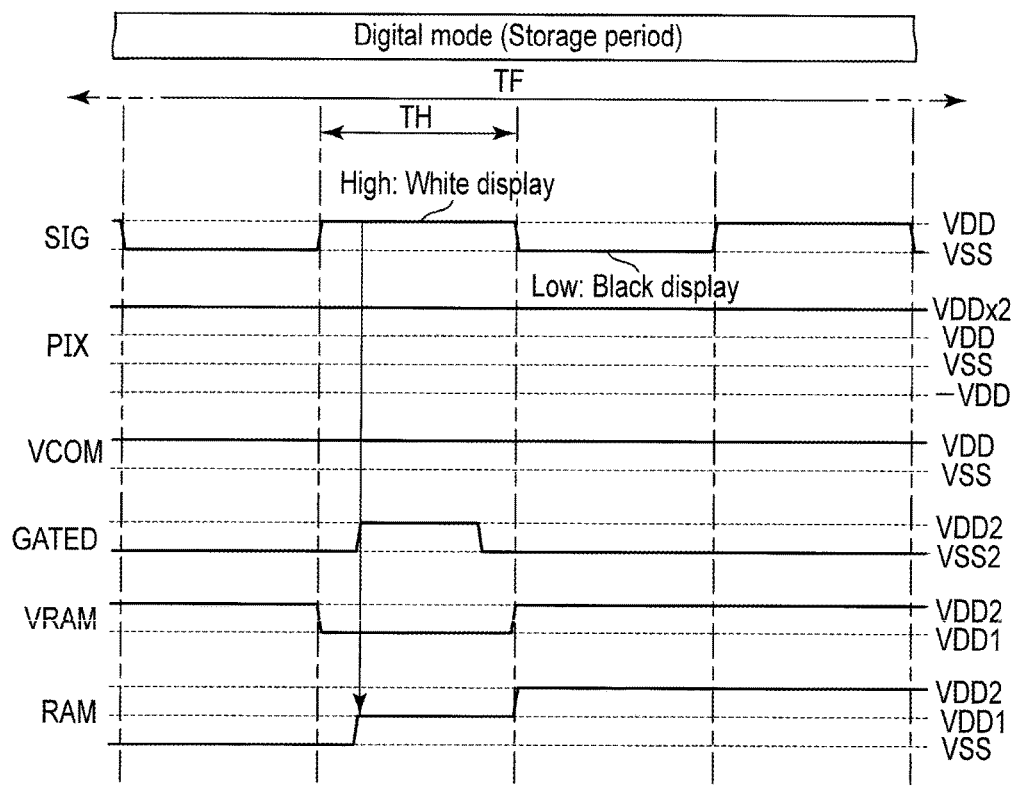
FIG. 4 is a timing chart showing an example of an operation in a storage period in the display device.

FIG. 4 is a timing chart showing an example of an operation in a storage period in the display device 1. This timing chart particularly looks at the subpixel SP shown in FIG. 3 and shows the change in a digital signal SIG, the pixel potential PIX of the pixel electrode PE, a common signal VCOM, a scanning signal GATED, power source voltage VRAM and the memory potential RAM stored in the memory 10.

In the following explanation, a period for writing a digital signal SIG to one horizontal line is defined as a horizontal period TH. In a horizontal period TH, the digital signal SIG of the signal line S is set to the potential to be written to each memory 10. It is assumed that high voltage VDD corresponds to white display, and low voltage VSS corresponds to black display. The power source voltage VRAM of the first power line LP1 is decreased from VDD2 to VDD1. Subsequently, the scanning signal GATED of the scanning line GD is increased from VSS2 to VDD2. Thus, switching element Q7 is turned on, and the memory 10 is connected to the signal line S. At this time, as shown by the arrow in the figure, the level of the digital signal SIG supplied to the signal line S is written to the memory 10. FIG. 4 shows an example in which a high signal is written to the memory 10.

Subsequently, the scanning signal GATED is decreased to VSS2. Thus, switching element Q7 is turned off, and the power source voltage VRAM is increased to VDD2 which is the voltage for turning switching elements Q1 and Q2 on. At this time, the voltage of the memory 10 is also increased from VDD1 to VDD2. In this way, the memory 10 connects the first power line LP1 and switching element Q1, and turns switching element Q1 on by the power source voltage VRAM. The memory 10 connects the second power line LP2 and switching element Q2, and turns switching element Q2 off by voltage VSS. Since switching element Q1 is turned on, the first drive signal xFRP of the first drive line DL1 is supplied to the select signal line 12a.

When the potential applied to the memory 10 is low so as to correspond to black display, the memory 10 connects the second power line LP2 and switching element Q1, and turns switching element Q1 off by voltage VSS. The memory 10 connects the first power line LP1 and switching element Q2, and turns switching element Q2 on by power source voltage VRAM. Since switching element Q2 is turned on, the second drive signal FRP of the second drive line DL2 is supplied to the select signal line 12a. The memory 10 exclusively turns one of switching elements Q1 and Q2 on by the stored voltage, and selects one of the first and second drive lines DL1 and DL2 as the connection destination of the select signal line 12a.

Figure 5:
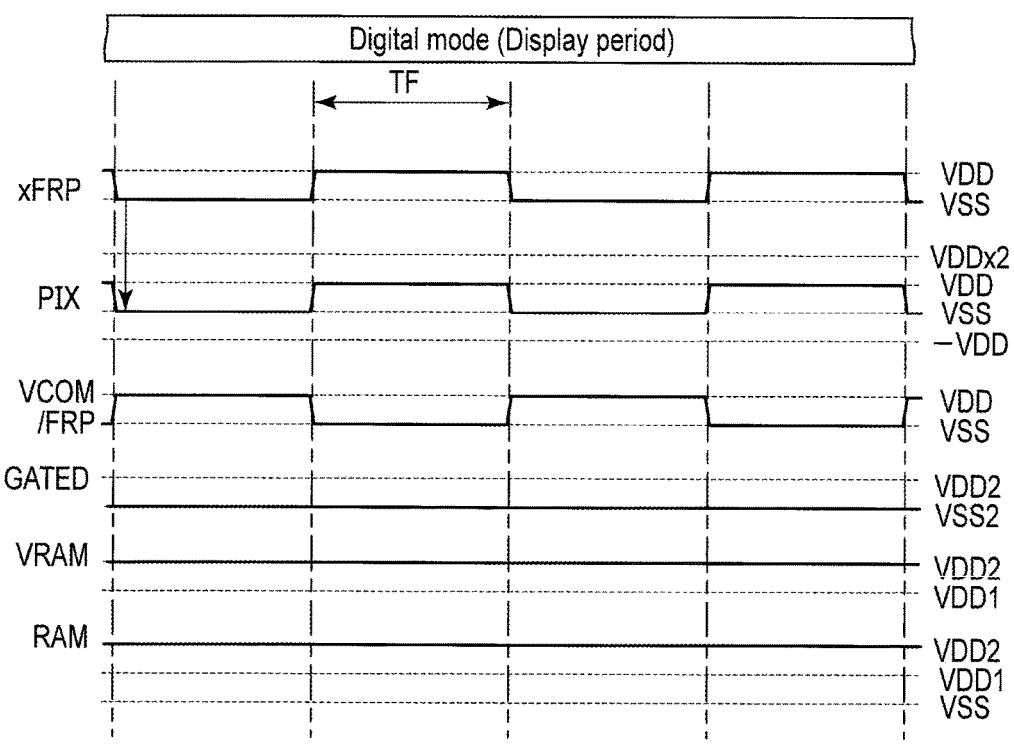
FIG. 5 is a timing chart showing an example of an operation in a display period in the display device.

FIG. 5 is a timing chart showing an example of an operation in a display period in the display device 1. This timing chart particularly looks at one subpixel SP in a manner similar to that of FIG. 4. In the examples of FIG. 4 and FIG. 5, frame-inversion control is used. In frame-inversion control, the polarity of potential between the pixel electrode PE and the common electrode CE is periodically inverted based on each frame period TF in all the subpixels SP arranged in the display area DA. A process for rewriting the memories 10 in each horizontal line constituting one frame is performed during, for example, one frame period TF. In other words, the series of horizontal periods TH shown in FIG. 4 is included in one frame period TF. In the horizontal periods TH shown in FIG. 4, signal VCOM is constant. However, as shown in FIG. 5, a display period includes a plurality of frame periods TF. In the display period, the potential of signals VCOM and FRP changes between VSS and VDD depending on each frame period TF.

The first drive signal xFRP is an AC signal having a phase opposite to that of the second drive signal FRP, and changes between voltage VDD and voltage VSS depending on each frame period TF.

In the display period, when switching element Q1 is turned on by the memory 10, the first drive line DL1 is connected to the pixel electrode PE. When switching element Q2 is turned on by the memory 10, the second drive line DL2 is connected to the pixel electrode PE. FIG. 5 shows an example in which the pixel potential PIX is set to the first drive signal xFRP since the first drive line DL1 is connected to the pixel electrode PE. In this case, the difference in potential is generated between the pixel electrode PE and the common electrode CE such that white display is applied to the subpixel SP. When the second drive line DL2 is connected to the pixel electrode PE, no difference in potential is generated between the pixel electrode PE and the common electrode CE such that black display is applied to the subpixel SP.

By the above operation, white display or black display is applied to each subpixel SP. In this way, an image is displayed in the display area DA.

Now, this specification explains the first circuit units 30 and the second circuit units 40 with reference to FIG. 6 and FIG. 7.

FIG. 6 shows the general structure of the first circuit unit 30. The first circuit unit 30 shown in FIG. 6 supplies a digital signal SIG to two subpixels SPR1 and SPR2 corresponding to red, two subpixels SPG1 and SPG2 corresponding to green, and two subpixels SPB1 and SPB2 corresponding to blue. For example, subpixels SPR1, SPG1 and SPB1 are included in one pixel PX. Subpixels SPR2, SPG2 and SPB2 are included in a pixel PX adjacent to the above pixel PX in the first direction X.

The first circuit unit 30 comprises a first shift register 31, a first latch circuit 32, a second latch circuit 33 and a first buffer circuit 34. The first latch circuit 32 comprises memory elements MA1 to MA6. The second latch circuit 33 comprises memory elements MB1 to MB6. The first buffer circuit 34 comprises buffer elements BA1 to BA6.

The first shift register 31 is connected to the first latch circuit 32 via two first connective lines CL1. Memory elements MA1 to MA6 are connected to memory elements MB1 to MB6 via respective second connective lines CL2. Memory elements MB1 to MB6 are connected to buffer elements BA1 to BA6 via respective third connective lines CL3. Buffer elements BA1 to BA6 are connected to the signal lines S extending to subpixels SPR1, SPG1, SPB1, SPR2, SPG2 and SPB2, respectively.

The first shift register 31, the first latch circuit 32, the second latch circuit 33 and the first buffer circuit 34 operate with voltages VDD1 and VSS as the drive power supply. When a reset signal xRST is input, the first shift register 31 clears outputs OUT and xOUT so as to be off-potential. When clock HCR is input, the first shift register 31 loads and latches the output data DI of the first shift register 31 of the first circuit unit 30 in the preceding stage (hereinafter, referred to as a preceding register). At this time, when the output data DI of the preceding register is high, output OUT of the first shift register 31 is made high, and output xOUT is made low. When the output data of the preceding register is low, output OUT of the first shift register 31 is made low, and output xOUT is made high.

Output OUT of the first shift register 31 is output to the first shift register 31 of the first circuit unit 30 in the next stage. Further, outputs OUT and xOUT of the first shift register 31 are supplied to memory elements MA1 to MA6 as latch pulses.

In the example of FIG. 6, data buses DBL extend between the first shift register 31 and the first latch circuit 32. The data buses DBL may extend between the first latch circuit 32 and the second latch circuit 33. The data buses DBL include six lines supplied with video data items R1, G1, B1, R2, G2 and B2. Video data items R1, G1, B1, R2, G2 and B2 are data items indicating a digital signal SIG supplied to subpixels SPR1, SPG1, SPB1, SPR2, SPG2 and SPB2, respectively.

When high output data DI is input to the first shift register 31, for example, video data items R1, G1, B1, R2, G2 and B2 supplied to the data buses DBL are latched by memory elements MA1 to MA6.

Timing pulses Ds and xDs are input to memory elements MB1 to MB6. Using timing pulses Ds and xDs, memory elements MB1 to MB6 latches the video data items latched by memory elements MA1 to MA6 at the same time. In this way, the time when video data items are transmitted from the first latch circuit 32 to the second latch circuit 33 is the same in, for example, all the first circuit units 30. Thus, the video data items of subpixels SP arranged in the first direction X (in a horizontal line) are provided in the second latch circuit 33 of each first circuit unit 30.

Buffer elements BA1 to BA6 output a digital signal SIG corresponding to the video data items latched by memory elements MB1 to MB6 to the signal lines S. In this way, a digital signal SIG is concurrently supplied to the signal lines S in accordance with the video data items latched by the second latch circuit 33 of each first circuit unit 30. Thus, data is written to the memory 10 of each subpixel SP. While a digital signal SIG is supplied, video data items R1, G1, B1, R2, G2 and B2 in the next horizontal line are latched by the first latch circuit 32.

According to the above structure, the video data items of two pixels PX can be processed by one first circuit unit 30. Thus, the drive frequency of the first driver unit 3 can be reduced. In addition, the video data items in the next horizontal line can be latched by the first latch circuit 32 while the video data items of the second latch circuit 33 are supplied to the signal lines S. Thus, the processing efficiency can be improved.

The first circuit unit 30 may include only one latch circuit. The first circuit unit 30 may supply a digital signal SIG to only the subpixels SP included in one pixel PX, or may supply a digital signal SIG to the subpixels SP included in three or more pixels PX.

FIG. 7 shows the general structure of the second circuit unit 40. The second circuit unit 40 comprises a second shift register 41, two second buffer circuits 42A and 42B, and a power supply circuit 43. The second shift register 41, second buffer circuits 42A and 42B and the power supply circuit 43 are connected to each other via fourth connective lines CL4.

The second shift register 41 and second buffer circuits 42A and 42B operate with voltages VDD2 and VSS as the drive power supply. The power supply circuit 43 operates with voltages VDD1 and VDD2 as the drive power supply. When a reset signal xRST is input, the second shift register 41 clears outputs OUT and xOUT so as to be, for example, off-potential. When clock VCK is input, the second shift register 41 loads and latches the output data DI of the second shift register 41 of the second circuit unit 40 in the preceding stage (hereinafter, referred to as a preceding register). For example, when the output data DI of the preceding register is high, output OUT of the second shift register 41 is made high, and output xOUT is made low. When the output data DI of the preceding register is low, output OUT of the second shift register 41 is made low, and output xOUT is made high.

Outputs OUT and xOUT of the second shift register 41 are supplied to second buffer circuits 42A and 42B, and are output to the second shift register 41 of the second circuit unit 40 in the next stage. Outputs OUT and xOUT are supplied to the power supply circuit 43. The power supply circuit 43 sets the above power source voltage VRAM so as to be high or low in accordance with the state of output OUT or xOUT.

Enable signal xENB1 is supplied to second buffer circuit 42A. Enable signal xENB2 is supplied to second buffer circuit 42B. For example, when outputs OUT and xOUT are high and low, respectively, and further when enable signal xENB1 is input, second buffer circuit 42A supplies a high scanning signal GATED to the scanning line GD connected to second buffer circuit 42A. For example, when outputs OUT and xOUT are high and low, respectively, and further when enable signal xENB2 is supplied, second buffer circuit 42B supplies a high scanning signal GATED to the scanning line GD connected to second buffer circuit 42B. In the subpixel SP connected to each scanning line GD supplied with a high scanning signal GATED, switching element Q7 is turned on. In this way, in these subpixels SP, a digital signal SIG supplied to the signal lines S can be written to the memories 10.

In the second circuit unit 40 having the above structure, when the second shift register 41 in a stage latches the data for driving, two scanning lines GD can be driven in order by enable signals xENB1 and xENB2. Thus, there is no need to prepare the second shift register 41 for each scanning line GD. In this manner, the driving frequency of the second shift register 41 can be reduced.

In a common display device, the display area DA is a rectangle having sides in the first direction X and sides in the second direction Y. In this case, normally, the first driver unit 3 is linearly provided in the first direction X, and the second driver unit 4 is linearly provided in the second direction Y. Since each of the first and second driver units 3 and 4 is provided along the display area DA, the first and second driver units 3 and 4 can be close to the display area DA over the entire length.

In the circular display area DA as shown in FIG. 1, if the first and second driver units 3 and 4 are linearly provided, a useless space is defined between the display area DA and the first or second driver unit 3 or 4. In the present embodiment, the first and second driver units 3 and 4 have an arc-shape along the display area DA as shown in FIG. 1. Further, in the first area A1, at least a part of the first driver unit 3 is provided between the second driver unit 4 and the display area DA. This structure allows prevention of a useless space in the peripheral area SA and reduction in the width of the frame.

However, in the first area A1, lines such as the scanning lines GD extending from the second driver unit 4 to the display area DA must pass through the area of the first driver unit 3. When the first and second driver units 3 and 4 have an arc-shape, the lines in these driver units must be bent where necessary. In consideration of this factor, the circuit layout of the first and second driver units 3 and 4 needs to be designed such that the efficiency is improved.

Figure 8:
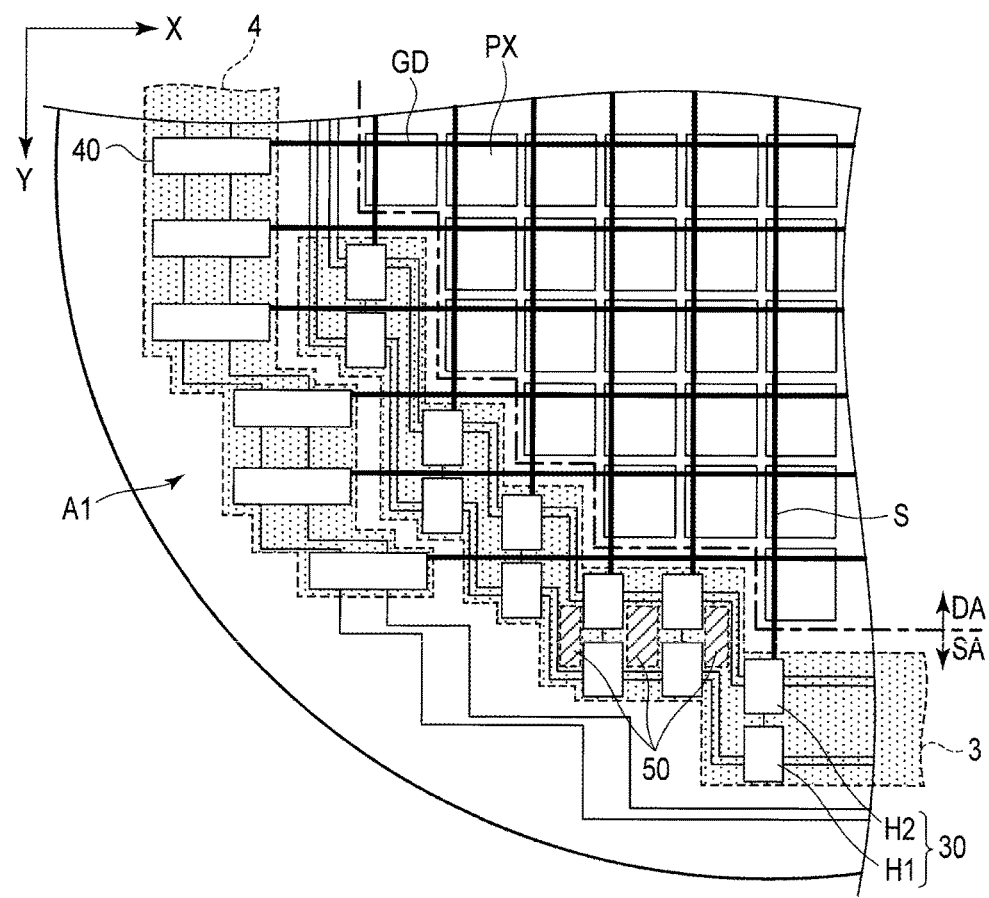
FIG. 8 shows an example of a circuit layout applicable to first and second driver units provided in the display device in a first area included in a peripheral area.

FIG. 8 shows an example of a circuit layout applicable to the first and second driver units 3 and 4. FIG. 8 shows the general structures of the peripheral area SA and the display area DA near the first area A1.

The first driver unit 3 comprises the first circuit units 30 arranged in an arc-form along the display area DA. In FIG. 8, a single signal line S is connected to a corresponding first circuit unit 30. However, more signal lines S (for example, six signal lines S as shown in FIG. 6) may be connected to a corresponding first circuit unit 30.

The second driver unit 4 comprises the second circuit units 40 arranged in an arc-form along the first driver unit 3 and the display area DA. In FIG. 8, a single scanning line GD is connected to a corresponding second circuit unit 40. However, more scanning lines GD (for example, two scanning lines GD as shown in FIG. 7) may be connected to a corresponding second circuit unit 40.

Each first circuit unit 30 is divided into two circuits. In the following explanation, one of the two circuits is called horizontal circuit H1, and the other one is called horizontal circuit H2. For example, at least one of the first shift register 31, the first latch circuit 32, the second latch circuit 33 and the first buffer circuit 34 shown in FIG. 6 is included in horizontal circuit H1. The other elements are included in horizontal circuit H2. Alternatively, horizontal circuits H1 and H2 may be defined by more-specific circuit elements. For example, horizontal circuit H1 may include memory elements MA1 to MA3, and horizontal circuit H2 may include memory elements MA4 to MA6. Each first circuit unit 30 may be divided in an arbitrary way, and various forms may be applied depending on the structure of the first circuit units 30. Further, each first circuit unit 30 may be divided into three or more horizontal circuits.

In the example of FIG. 8, horizontal circuits H1 and H2 are linearly arranged in the second direction Y. Moreover, the scanning line GD extends in the first direction X between horizontal circuits H1 and H2. Horizontal circuits H1 and H2 are electrically connected to each other via a connective line provided in a layer different from that of the scanning line GD.

If each first circuit unit 30 is not divided into a plurality of horizontal circuits, the scanning lines GD must be bent so as to avoid the first circuit units 30. Thus, there is a need to define a space around the first circuit units 30 such that the scanning lines GD avoid the first circuit units 30. In the example of FIG. 8, the scanning liens GD are allowed to extend to the display area DA without bending the first circuit unit 30. Thus, it is possible to minimize the space for the scanning lines GD. In this way, the layout of the peripheral area SA is improved in terms of efficiency.

FIG. 9 shows another example of a circuit layout applicable to the first and second driver units 3 and 4. In the example of FIG. 9, in addition to the first circuit units 30, each second circuit unit 40 is divided into two circuits. In the following explanation, one of the two circuits is called vertical circuit V1, and the other one is called vertical circuit V2. Vertical circuits V1 and V2 are electrically connected to each other via one or more connective lines.

For example, at least one of the second shift register 41, second buffer circuits 42A and 42B and the power supply circuit 43 shown in FIG. 7 is included in vertical circuit V1. The other elements are included in vertical circuit V2. Each second circuit unit 40 may be divided in an arbitrary way, and various forms can be applied depending on the structure of the second circuit units 40. Each second circuit unit 40 may be divided into three or more vertical circuits.

In the example of FIG. 9, horizontal circuits H1 and H2 are arranged in the second direction Y in a manner similar to that of FIG. 8. However, horizontal circuits H1 and H2 are out of alignment in the first direction X. Specifically, horizontal circuits H1 shift to the left (in a direction away from the display area DA) in comparison with respective horizontal circuits H2 in the figure. When two circuits are out of alignment in the first direction X, for example, the line segment connecting the center of one of the two circuits in the first direction X and the center of the other one in the first direction X is not parallel to the second direction Y.

When horizontal circuits H1 and H2 are out of alignment in the above manner, the layout of the peripheral area SA can be further improved in terms of efficiency. In the example of FIG. 8, a space like an area 50 may be defined around each first circuit unit 30. However, in the example of FIG. 9, such an area can be effectively used to arrange each first circuit unit 30.

Vertical circuits V1 and V2 are arranged in the first direction X. Vertical circuits V1 and V2 are out of alignment in the second direction Y. Specifically, vertical circuits V1 shift to the lower side in comparison with respective vertical circuits V2 in the figure. When two circuits are out of alignment in the second direction Y, for example, the line segment connecting the center of one of the two circuits in the second direction Y and the center of the other one in the second direction Y is not parallel to the first direction X.

Now, this specification explains the circuit layout in the second area A2. FIG. 10 shows an example of a circuit layout applicable to the second driver unit 4 in the second area A2. This second driver unit 4 corresponds to the second driver unit 4 shown in FIG. 8. Thus, each second circuit unit 40 is not divided into a plurality of vertical circuits. However, each second circuit unit 40 may be divided into a plurality of vertical circuits in a manner similar to that of FIG. 9. For example, even when each second circuit unit 40 is divided into vertical circuits V1 and V2 in the first area A1 as shown in FIG. 9, each second circuit unit 40 may not be divided in the second area A2.

In the second area A2, no first driver unit 3 is provided between the second driver unit 4 and the display area DA. Thus, the second driver unit 4 is allowed to be close to the display area DA in comparison with FIG. 1 and FIG. 10. For example, when the distance between the second circuit units 40 and the display area DA in the first area A1 is a first distance, and the distance between the second circuit units 40 and the display area DA in the second area A2 is a second distance, the second distance can be less than the first distance.

Now, this specification explains a specific example of a circuit layout applicable to the first area A1 with reference to FIG. 11. FIG. 11 shows some of the subpixels SP arranged in the display area DA in addition to the first area A1 (peripheral area SA).

FIG. 11 shows four first circuit units 30 and three second circuit units 40. A first line WL1 supplied with the first drive signal xFRP and a second line WL2 supplied with the second drive signal FRP extend between the first circuit units 30 and the display area DA. For example, the first drive line DL1 shown in FIG. 3 is connected to the first line WL1. For example, the second drive line DL2 shown in FIG. 3 is connected to the second line WL2. In the example of FIG. 11, a third line WL3 to which voltage VSS is applied and a fourth line WL4 to which voltage VDD1 is applied further extend between the first circuit units 30 and the display area DA. Voltages VSS and VDD1 of the third and fourth lines WL3 and WL4 are also applied to the subpixels SP and are used to drive the memories 10. The first to fourth lines WL1 to WL4 are bent alone the display area DA. In FIG. 11, the first to fourth lines WL1 to WL4 are bent in a stepwise manner. The number of corresponding first circuit units 30 differs depending on the stage. Specifically, the number of first circuit units 30 corresponding to the central stage (first stage) of the first to fourth lines WL1 to WL4 in FIG. 11 is two (HU1 and HU2). The number of first circuit units 30 corresponding to the stages (second stages) adjacent to the central stage is one. Since the number of corresponding first circuit units 30 differs depending on the stage, the space can be efficiently used. The number of first circuit units 30 adjacent to each other in the first stage is not limited to two, and may be another number. The number of first circuit units 30 in each second stage is not limited to one, and may be another number.

For example, a guard ring 60 supplied with a common signal VCOM is provided in the peripheral area SA in a circular pattern along the outer circumferential edge of the peripheral area SA. The guard ring 60 functions to prevent the static electricity, etc., supplied from outside from having an influence on each circuit of the peripheral area SA. The first and second circuit units 30 and 40 are provided between the guard ring 60 and the display area DA.

Dummy pixels DSP are arranged along the outline of the display area DA between the first line WL1 and the display area DA. For example, in a planar view, the dummy pixels DSP have the same shape as the subpixels SP, and are arranged at the same pitch as the subpixels SP. For example, each dummy pixel DSP comprises the pixel electrode PE and the gate circuit 11; however, at least, each dummy pixel DSP does not comprise the memory 10. The second drive signal FRP which is a non-display signal is always supplied to the pixel electrode PE of each dummy pixel DSP. Thus, black display is always applied to each dummy pixel DSP. Each dummy pixel DSP is a pixel which does not display an image.

The number of columns of pixels (signal lines) driven by each first circuit unit 30 is two or more, and is six in FIG. 11. The number of dummy pixels DSP connected to each signal line S differs in the six signal lines S. When the adjacent first circuit units 30 are compared with each other, the mean number of dummy pixels DSP connected to each signal line S differs. Specifically, in FIG. 11, the mean number of dummy pixels DSP connected to each signal line S corresponding to HU1 equivalent to the first circuit unit 30 in the first area A1 is 1.6 (8/5). The mean number of dummy pixels DSP connected to each signal line S corresponding to HU2 equivalent to the first circuit unit 30 in the first area A1 is 0.6 (3/5). In the entire edge of the display area DA, the dummy pixels DSP are randomly arranged, and fill the space between the first line WL1 and the display area DA.

Figure 12:
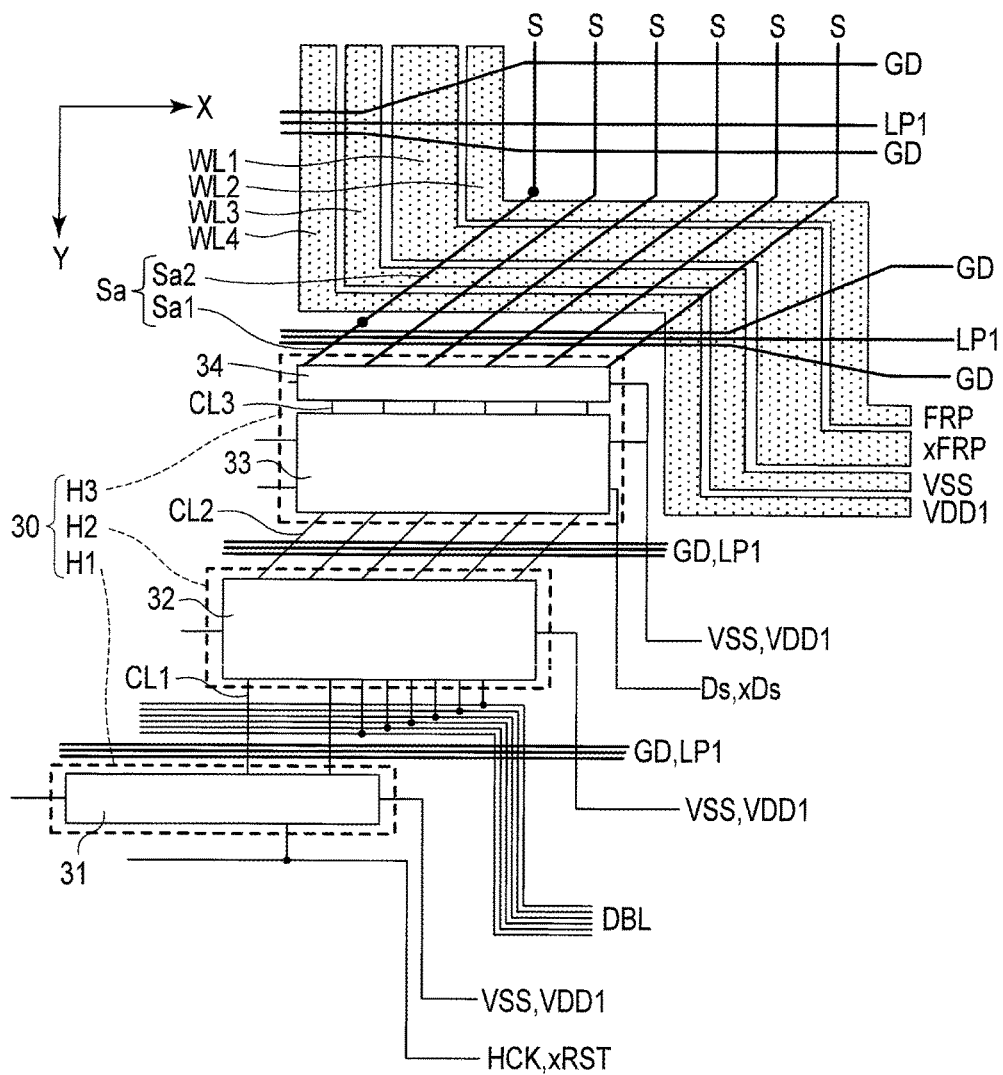
FIG. 12 is an enlarged view of the first circuit unit of FIG. 11.

FIG. 12 is an enlarged view of the first circuit unit 30 of FIG. 11. FIG. 13 is an enlarged view of the second circuit unit 40 of FIG. 11. The first circuit unit 30 of FIG. 12 comprises horizontal circuits H1, H2 and H3 (first to third circuits, respectively). Horizontal circuit H1 includes the first shift register 31. Horizontal circuit H2 includes the first latch circuit 32. Horizontal circuit H3 includes the second latch circuit 33 and the first buffer circuit 34. Horizontal circuits H1 and H2 are connected via the above first connective lines CL1. Horizontal circuits H2 and H3 are connected via the above second connective lines CL2. In horizontal circuit H3, the second latch circuit 33 is connected to the first buffer circuit 34 via the above third connective lines CL3.

Lines which apply voltages VSS and VDD1 and supply clock HCK and a reset signal xRST to the first shift register 31 are connected to horizontal circuit H1. A line which applies voltages VSS and VDD1 to the first latch circuit 32 is connected to horizontal circuit H2. Lines which apply voltages VSS and VDD1 and timing pulses Ds and xDs to the second latch circuit 33 and the first buffer circuit 34 are connected to horizontal circuit H3. In FIG. 11 and FIG. 12, to simplify the figures, a plurality of lines connected to horizontal circuits H1 to H3 are arbitrarily shown by a single line segment.

The second circuit unit 40 of FIG. 13 comprises vertical circuits V1 and V2 (fourth and fifth circuits, respectively). Vertical circuit V1 includes the second shift register 41. Vertical circuit V2 includes second buffer circuits 42A and 42B and the power supply circuit 43. Vertical circuits V1 and V2 are connected via the above fourth connective line CL4. Second buffer circuits 42A and 42B are connected to respective scanning lines GD. The power supply circuit 43 is connected to the first power line LP1 which applies power source voltage VRAM.

Lines which apply voltages VSS and VDD2 and supply clock VCK and a reset signal xRST to the second shift register 41 are connected to vertical circuit V1. Lines which apply voltages VSS, VDD1 and VDD2 and supply enable signals ENB1 and ENB2 to second buffer circuits 42A and 42B and the power supply circuit 43 are connected to vertical circuit V2. In FIG. 11 and FIG. 13, to simplify the figures, a plurality of lines connected to vertical circuits V1 and V2 are arbitrarily shown by a single line segment.

As shown in FIG. 12, the two scanning lines GD (first scanning lines) and the first power line LP1 connected to a second circuit unit 40 extend in the first direction X between horizontal circuits H1 and H2. The two scanning lines GD (second scanning lines) and the first power line LP1 connected to another second circuit unit 40 extend in the first direction X between horizontal circuits H2 and H3. Further, the two scanning lines GD and the first power line LP1 connected to another second circuit unit 40 extend in the first direction X between horizontal circuit H3 and the fourth line WL4. The data buses DBL extend in the first direction X between horizontal circuits H1 and H2.

In a planar view, the scanning lines GD, the first power line LP1 and the data buses DBL between horizontal circuits H1 and H2 intersect with the first connective lines CL1. In a planar view, the scanning lines GD and the first power line LP1 between horizontal circuits H2 and H3 intersect with the second connective lines CL2.

In the example of FIG. 12, the signal lines S are connected to the first buffer circuit 34 via lead lines Sa connected to the first buffer circuit 34. The scanning lines GD and the first power line LP1 between horizontal circuit H3 and the fourth line WL4 intersect with the lead lines Sa in a planar view. Further, the first to fourth lines WL1 to WL4 intersect with the lead lines Sa in a planar view.

Horizontal circuits H1 to H3 are arranged in the second direction Y. Horizontal circuits H1 to H3 are out of alignment in the first direction X. Specifically, horizontal circuit H2 shifts to the left in comparison with horizontal circuit H3 in the figure. Horizontal circuit H1 further shifts to the left in comparison with horizontal circuit H2. The lines are bent from the first direction X to the second direction Y in areas generated by shifting horizontal circuits H1 to H3 in the above manner.

In the example of FIG. 12, the signal lines S are out of alignment with respect to horizontal circuit H3 (the first buffer circuit 34) in the first direction X. The lead lines Sa extend such that they are inclined in a direction intersecting with both the first direction X and the second direction Y. Since the signal lines S are out of alignment with respect to horizontal circuit H3, the circuit layout of the peripheral area SA can be more freely designed. The first circuit unit 30 does not have to be provided on the extended lines of the signal lines S as the connection destination. In the example of FIG. 12, the second connective lines CL2 also extend such that they are inclined in a direction intersecting with both the first direction X and the second direction Y. When lines are inclined in a manner similar to that of the lead lines Sa and the second connective lines CL2, the lines can be shorter than when they are bent in the first and second directions X and Y. In this manner, the space of the peripheral area SA can be more effectively used.

In the example of FIG. 13, vertical circuits V1 and V2 are arranged in the first direction X, and are out of alignment in the second direction Y. In areas generated by shifting vertical circuits V1 and V2 in this manner, the lines are bent from the first direction X to the second direction Y.

For example, each line shown in FIG. 11 to FIG. 13 is formed of a metal material or a conductive material such as ITO in first and second layers of the first substrate SUB1. An insulating layer is provided between the first layer and the second layer. One of two lines intersecting with each other in FIG. 11 to FIG. 13 is formed in the first layer. The other one is formed in the second layer. Thus, these lines are not electrically connected to each other.

For example, the scanning lines GD and the first power lines LP1 are formed in the first layer. The other lines such as the signal lines S, the first to fourth lines WL1 to WL4 and the data buses DEL are formed in the second layer. For example, the first connective lines CL1 need to avoid the scanning lines GD and the first power line LP1 formed in the first layer and the data buses DEL formed in the second layer. In this case, of the first connective lines CL1, the portion intersecting with the scanning lines GD and the first power line LP1 may be formed in the second layer. The portion intersecting with the data buses DEL may be formed in the first layer. These two portions may be connected to each other via a contact hole provided in the insulating layer.

The first substrate SUB1 is not limited to a structure having two layers including the first and second layers. The first substrate SUB1 may have more layers such that the lines are dispersed into the layers.

Each lead line Sa comprises a first portion Sa1 intersecting with the scanning lines GD and the first power line LP1 between horizontal circuit H3 and the fourth line WL4, and a second portion Sa2 intersecting with the first to fourth lines WL1 to WL4. The first portion Sa1 extends from horizontal circuit H3 to the contact position between the scanning lines GD and the fourth line WL4. The second portion Sa2 extends from the above contact position to the signal line S. The first portion Sa1 is formed in the second layer to avoid the scanning lines GD and the first power line LP1 formed in the first layer. The second portion Sa2 is formed in the first layer to avoid the first to fourth lines WL1 to WL4 formed in the second layer. The first portion Sa1 is connected to the second portion Sa2 at the contact position.

As is clear from FIG. 12, if the lead lines Sa extend in the second direction Y, and are connected to the signal lines S on the extended lines of the lead lines Sa, the lead lines Sa pass through the area in which the scanning lines GD and the first power line LP1 intersect with the first to fourth lines WL1 to WL4. The scanning lines GD and the first power line LP1 are formed in a layer different from that of the first to fourth lines WL1 to WL4 to avoid electrical contact. Thus, a new layer for forming the lead lines Sa is required to cause the lead lines Sa to pass through the area. However, when the lead lines Sa are inclined so as to avoid the area in which the scanning lines GD and the first power line LP1 intersect with the first to fourth lines WL1 to WL4 as shown in FIG. 12, there is no need to provide a new layer.

In the embodiment explained above, at least a part of the first driver unit 3 is provided between the second driver unit 4 and the display area DA. In this way, it is possible to prevent a useless space in the peripheral area SA, and reduce the width of the frame.

Further, each first circuit unit 30 is divided into a plurality of horizontal circuits such that the scanning lines GD and the data buses DBL pass between the horizontal circuits. In this way, the circuit layout of the peripheral area SA can be improved in terms of efficiency.

In addition, the horizontal circuits are out of alignment. Thus, the circuit layout of the peripheral area SA can be further improved in terms of efficiency. When each second circuit unit 40 is divided into a plurality of vertical circuits, and the vertical circuits are out of alignment, a similar effect can be obtained.

Apart from this effect, various effects can be obtained from the present embodiment as described earlier.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above embodiment, the display device in digital mode is disclosed. However, the circuit layout of the peripheral area SA in the above embodiment may be applied to a display device in analog mode in which an analog video signal is supplied to each pixel electrode PE via signal lines S to obtain a multilevel display image. Further, the circuit layout of the peripheral area SA in the above embodiment may be applied to a display device having both the function of digital mode and the function of analog mode.

The structures of the first and second circuit units 30 and 40 disclosed in FIG. 6 and FIG. 7 and the circuit layout of the peripheral area SA disclosed in FIG. 11 to FIG. 13 are merely examples. Some of the circuit elements or lines shown in the drawings may be appropriately removed. A new circuit element or line may be added.

What is claimed is:

1. A display device comprising:
a first substrate having a circumferential edge which corresponds to at least a part of an outline of the first substrate;
a plurality of pixels arranged in matrix in a first direction and a second direction in a display area;
a plurality of dummy pixels each of which does not display an image;
a guard ring located between the circumferential edge and the display area; and
a gate driver located between the guard ring and the display area,
wherein
the guard ring is provided along the circumferential edge and a part of the gate driver is adjacent the guard ring,
the guard ring has a stepwise pattern in which a width of the guard ring in the second direction gradually changes along the first direction,
the plurality of dummy pixels are arranged along an outline of the display area between the circumferential edge and the display area, and
a number of the dummy pixels in the first direction differs along the second direction.

2. The display device of claim 1, further comprising a source driver, wherein
a part of the source driver is located between the part of the gate driver and the display area.

3. The display device of claim 1, wherein the guard ring is supplied with a common potential.

4. A display device comprising:
a first substrate having a circumferential edge which corresponds to at least a part of an outline of the first substrate;
a plurality of pixels arranged in matrix in a first direction and a second direction in a display area;
a plurality of dummy pixels each of which does not display an image,
a guard ring located between the circumferential edge and the display area;
a gate driver located between the guard ring and the display area; and
a source driver,
wherein
the guard ring is provided along the circumferential edge and a part of the gate driver is adjacent the guard ring,
the guard ring has a stepwise pattern in which a width of the guard ring in the second direction gradually changes along the first direction,
a part of the source driver is located between the part of the gate driver and the display area,
the plurality of dummy pixels are arranged along an outline of the display area between the circumferential edge and the display area,
the plurality of pixels include a first row pixel group and a second row pixel group adjacent to the first row pixel group in the second direction, and
a number of the dummy pixels arranged next to the first row pixel group in the first direction is different from a number of the dummy pixels arranged next to the second row pixel group in the first direction.

5. The display device of claim 4, further comprising a first voltage line located between the dummy pixels and the part of the source driver, wherein
the first voltage line extends stepwise along the circumferential edge.

6. The display device of claim 5, further comprising:
a first column pixel group; and
a data signal line connected to the first column pixel group, wherein
the data signal line extends in the second direction in the display area,
the source driver is electrically connected to the data signal line, and
the data signal line obliquely intersects the first voltage line.

7. The display device of claim 4, wherein
each of pixel of the plurality of pixels includes three sub pixels, and
the dummy pixel has a same shape as the sub pixel and arranged at a same pitch as the sub pixel.

* * * * *